United States Patent [19]

Leete

[11] 3,887,836

[45] June 3, 1975

[54] OPTICAL DRIVER CIRCUIT

[75] Inventor: Bernard D. Leete, Newtown Square, Pa.

[73] Assignee: General Electric Company, Philadelphia, Pa.

[22] Filed: Sept. 20, 1973

[21] Appl. No.: 399,254

[52] U.S. Cl. ................ 315/207; 250/552; 307/311; 315/200 A; 315/227; 315/240

[51] Int. Cl. ........................................... H05b 37/00

[58] Field of Search........ 250/552; 307/252 M, 311; 315/200 A, 205, 207, 227, 240

[56] References Cited

UNITED STATES PATENTS 3,373,315 3/1968 Colman.............................. 315/240

3,591,829 7/1971 Murata et al....................... 315/151

*Primary Examiner*—R. V. Rolinec
*Assistant Examiner*—Lawrence J. Dahl
*Attorney, Agent, or Firm*—J. Wesley Haubner; Albert S. Richardson, Jr.

[57] ABSTRACT

A light-emitting diode is connected through a capacitor to a d-c power supply from which the capacitor accumulates a charge. A thyristor is connected in parallel with the capacitor and the light-emitting diode, and when a control signal is applied to its gate the thyristor turns on and discharges the capacitor through the light-emitting diode which emits a light signal. A commutating circuit responsive to turn on of the thyristor turns off the thyristor after a predetermined time interval.

9 Claims, 3 Drawing Figures

OPTICAL DRIVER CIRCUIT

BACKGROUND

This invention generally relates to light pulse generators, and more particularly it relates to a circuit for convering an electrical control signal into a sharp pulse of light.

In signal transmission systems and the like, it is sometimes desirable to use light sources which are capable of generating relatively short but bright optical signals on command of periodic electrical input pulses. U.S. Pat. Nos. 3,355,600—Mapham and 3,541,341—Leete can be referred to for examples of practical applications for such a light source. As I described, for example, in the latter patent, light pulses of high intensity can be advantageously obtained by briefly overdriving a plurality of light-emitting diodes. Toward this end the current pulses energizing the light-emitting diodes should each be characterized by a waveform having a steeply rising front, a high amplitude, and a sufficient length (duration) to ensure activation of the diodes and affirmative response by whatever light sensitive elements are controlled thereby. Such pulses should be consistently generated each time a proper control signal is received, and they should not be produced due to extraneous signals (noise).

SUMMARY OF THE INVENTION

Accordingly, it is an object of this invention to provide an improved light pulse generation circuit characterized by affirmative and reliable response to periodic activation by a train of discrete electrical control signals.

It is another object of this invention to provide a circuit for driving a light-emitting diode to a high current peak having a short rise time in which average power dissipation in the light-emitting diode is comparatively low.

Briefly, according to one embodiment of the invention, there is provided a capacitor in series with at least one light-emitting diode. The capacitor is also connected to a d-c power supply from which it accumulates a charge. A thyristor is connected across the series combination of the capacitor and light-emitting diode. When a control signal is applied to the gate of the thyristor, the thyristor turns on, discharging the precharged capacitor through the diode which consequently emits a light signal of desired form. A series L-C circuit is connected in parallel with the aforesaid capacitor to automatically commutate off the thyristor at the end of the discharge interval. The capacitor is then quickly recharged from the d-c power supply, and the described circuit is soon ready for a repeat operation whenever the thyristor is next turned on.

DETAILED DESCRIPTION

The subject matter which I regard as my invention is particularly pointed out and distinctly claimed in the concluding portion of this specification. Embodiments of the invention, both as to their organization and their method of operation, together with further objects and advantages thereof, may be understood by reference to the following description taken in connection with the accompanying drawing in which:

Figure 1:
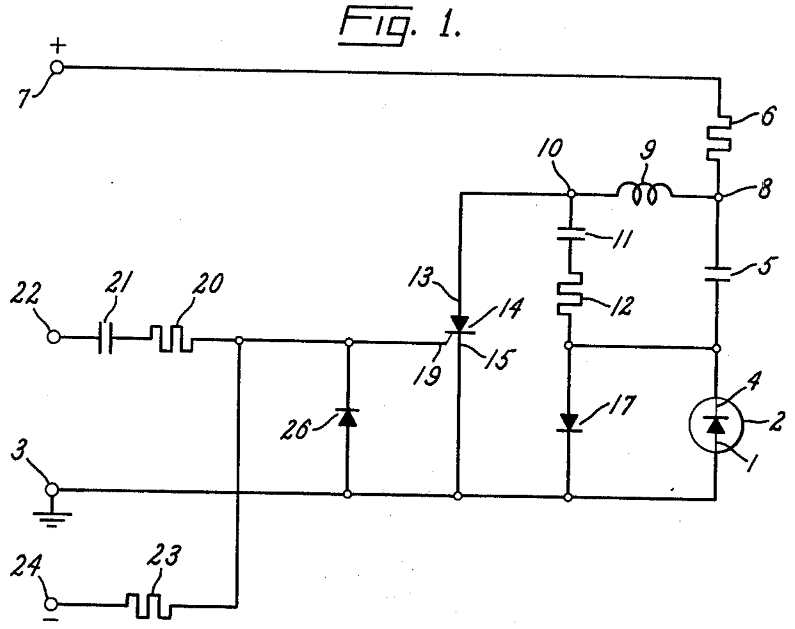
FIG. 1 is a schematic circuit diagram of an optical driver circuit constructed in accordance with this invention.

In FIG. 1 there is shown a source of light comprising an element 2 which is suitably constructed and arranged to issue an optical output signal when energized by an appropriate electrical input signal. Preferably the element 2 is a semiconductor device of a type well known in the art as a light-emitting diode. Its anode 1 is connected directly to a grounded terminal 3 of a d-c power supply (not shown), and its cathode 4 is connected via a resistor 12 and a capacitor 11 to a terminal 10 which is coupled to another terminal 7 of the d-c power supply. Terminal 7 is at a relatively positive potential. The capacitor 11 accumulates a charge from the d-c supply power, with the charging current following a path including a regular diode 17 which shunts the light-emitting diode 2. Polarities are such that the light-emitting diode will conduct capacitor discharge current which therefore serves as the aforesaid input signal.

A controllable switching means 14 comprising a thyristor or the like is connected in parallel with the series combination of the light-emitting diode 2 and the capacitor 11. The anode 13 of this thyristor is connected to the positive plate of the capacitor 11, and the cathode 15 is connected to the anode 1 of the diode 2. The gate 19 of the thyristor 14 is connected through a resistor 20 and a capacitor 21 to a terminal 22 to which a relatively positive control signal is periodically applied. Each time a control signal is applied to the terminal 22, gate current is supplied to the thyristor 14 which is thereby turned on.

For subsequently turning off the thyristor 14, I provide suitable commutating means which is operative in delayed response to the turn on action. Preferably the commutating means comprises a series combination of an inductor 9 and another capacitor 5 which combination is connected in parallel with the capacitor 11 and has a "ringing" effect. As is shown in FIG. 1, the junction 8 of the inductor 9 and the capacitor 5 is connected through a resistor 6 to the positive d-c power supply terminal 7, whereby the inductor 9 is included in the charging circuit of the capacitor 11.

In order to minimize the possibility of undesired turn on of the thyristor 14 by electrical noise, a relatively negative bias is maintained on the gate 19 until the aforesaid control signal is applied to the terminal 22. Toward this end, there is provided a diode 26 having an anode connected to the cathode 15 of the thyristor 14 and a cathode connected to the gate 19. By connecting the gate 19 through a resistor 23 to a relatively negative terminal 24 of the d-c power supply, the diode 26 is normally forward biased and consequently the gate 19 is normally at a negative potential with respect to the cathode 15.

In operation, the thyristor 14 is normally turned off and the d-c power supply to which terminals 3 and 7 are connected continuously recharges both of the capacitors 5 and 11. When a positive control signal is applied to the terminal 22, the resulting charging current of the differentiating capacitor 21 provides a gate pulse for triggering the thyristor 14, and the thyristor turns on. The waveform, amplitude, and duration of this control signal are not critical so long as sufficient gate current is provided to ensure that the thyristor latches in. With the thyristor 14 turned on, the precharged capacitor 11 is switched across the light-emitting diode 2 and immediately discharges therethrough. The capacitor discharge current, which has a very short rise time and a relatively high peak, overdrives the diode 2 which consequently emits the desired light pulse. The resistor 12 has a relatively low ohmic value which safely limits the initial surge of discharge current and dampens oscillations.

In the FIG. 1 embodiment, the initial current pulse through the light-emitting diode 2 is extended or broadened slightly by a subsequent L-C discharge of capacitor 5 through inductor 9. The ringing effect of this L-C discharge is also operative to commutate off the thyristor 14 in delayed response to its turn on. As the L-C current oscillates to zero and reverses direction, it nullifies any small amount of discharge current still flowing in the capacitor 11 and hence reduces the anode current in the thyristor to zero, whereupon the thyristor turns off. The diode 17 provides a ready path for commutating current. The length of time that the thyristor conducts is determined by the parameters of the L-C subcircuit comprising inductor 9 and capacitor 5 and of the R-C subcircuit comprising resistor 12 and capacitor 11. To facilitate commutation of the thyristor 14, the ohmic value of the resistor 6 connected to the positive d-c power supply terminal 7 is made as large as possible consistent with the control signal repetition rate so as to minimize the rate of reapplication of forward anode voltage on this thyristor. Further commutation assistance is provided by the negative bias on the gate 19 of the thyristor 14 after the gate pulse expires. This negative bias also furnishes a degree of noise immunity for the illustrated circuit. Thus, the circuit of FIG. 1 reliably produces a light pulse of desired intensity and duration by supplying a high current pulse having a short rise time through the light-emitting diode 2 in response to receipt of a control signal of non-critical waveform or amplitude.

Figure 2:
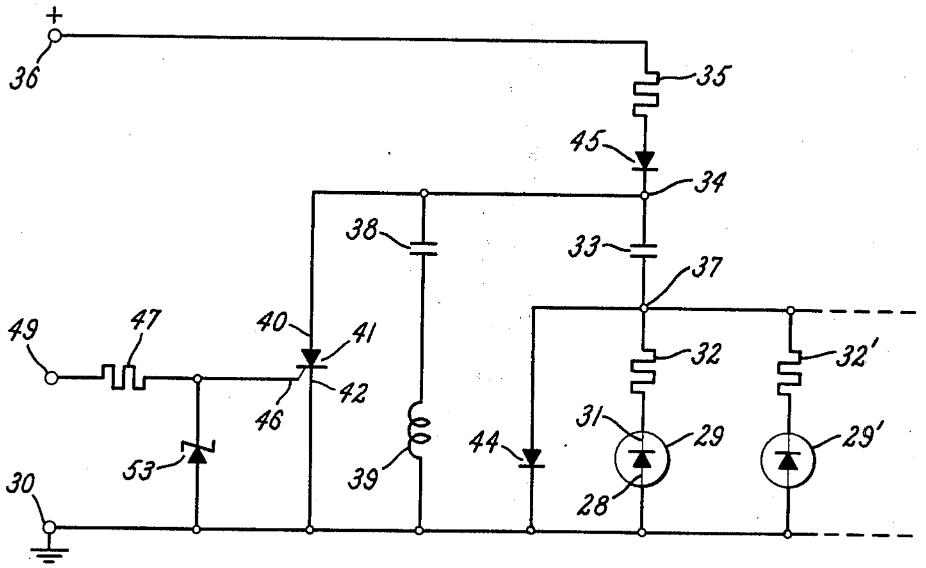
FIG. 2 is a detailed circuit diagram of a presently preferred embodiment of the invention.

FIG. 2 shows another embodiment of an optical driver circuit having a light source and a switching thyristor in accordance with this invention in which a light pulse of shorter duration is generated. As before, an optical output signal is issued upon energizing at least one light-emitting element or diode 29 with an appropriate electrical input signal. The anode 28 of the diode 29 is connected to a grounded terminal 30 of a d-c power supply (not shown), and its cathode 31 is connected through a resistor 32 to a terminal 37. The terminal 37 in turn is connected through a capacitor 33 to a terminal 34 which is coupled through an isolating diode 45 and a resistor 35 to a d-c supply power terminal 36 of relatively positive potential. The diode 29 is shunted by an inversely poled diode 44 which permits charging current to flow from terminal 36 through capacitor 33 to terminal 30, and if desired a resistor can also be connected in parallel therewith. A controllable switching means comprising a thyristor 41 or the like has its anode 40 connected to the terminal 34 and its cathode 42 connected to the anode 28 of the light-emitting diode 29. The gate 46 of the thyristor 41 is connected through a resistor 47 to a terminal 49 to which a discrete control signal of appreciable positive potential (e.g., 15 volts) is periodically applied. To prevent excessive potential on the gate 46, a zener diode 53 is connected between this gate and the cathode 42. For turning off the thyristor 41, a ringing subcircuit comprising an inductor 39 in series with a capacitor 38 is connected in parallel with the capacitor 33 and the light-emitting diode 29 as shown.

In operation of the circuit of FIG. 2, the thyristor 41 is normally off, and both of the capacitors 33 and 38 are maintained in a charged state by the d-c power supply to which the terminals 30 and 36 are connected. When a control signal is applied to the terminal 49, a gate pulse is provided for triggering the thyristor 41. Once turned on in this manner, the thyristor 41 switches precharged capacitor 33 across the light-emitting diode 29, and the resulting capacitor discharge current serves as an input signal for energizing the diode 29 which consequently causes the light source to issue an optical output signal of desired form. Concurrently the capacitor 38 discharges through the inductor 39 and the thyristor 41 until a point is reached after a predetermined time interval where, because of the ringing effect, the net anode current of the thyristor is reduced to zero and reverses, thereby commutating off the thyristor 41.

Figure 3:
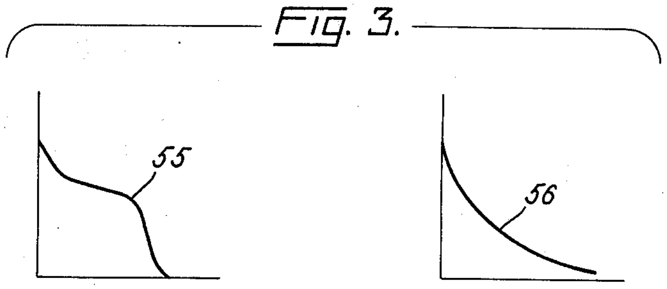
FIG. 3 is a drawing of the waveforms of current pulses produced in the circuits of FIGS. 1 and 2.

FIG. 3 shows waveforms of the input current pulses for the light-emitting diode 2 in FIG. 1 and for the light-emitting diode 29 in FIG. 2, respectively. Waveform 55 shows the pulse produced by the circuit of FIG. 1 and illustrates the broadening effect of the L-C subcircuit used in the circuit of FIG. 1. Waveform 56 shows the narrower current pulse through light-emitting diode 29 in FIG. 2. It can be appreciated from FIG. 3 that broadening of current pulse 55 by the circuit of FIG. 1 dissipates more power in the light-emitting diode than the narrow pulse 56 produced by the circuit of FIG. 2. If a longer pulse were desired in the FIG. 2 embodiment, another series inductor-capacitor combination can be connected across the capacitor 33.

My invention is particularly well suited for generating a steep-rising high-current pulse for simultaneously energizing a plurality of duplicate light-emitting diodes in a parallel array. FIG. 2 illustrates a second such diode 29′ connected in parallel with the first, with a separate resistor 32′ being individually connected in series with the second diode. More specifically, an array of seven parallel resistor-diode combinations are contemplated, and exemplary parameters for such an arrangement are listed below:

| | |
|---|---|
| d-c power supply | 160 volts |
| resistor 35 | 1,500 ohms |
| capacitor 33 | 1 microfarad |
| capacitor 38 | 0.1 microfarad |
| inductor 39 | 10 microhenrys |
| resistors 32, 32′ etc. | 8 ohms each |
| light-emitting diodes 29, 29′ etc. | GE type SSL-34 (gallium-arsenide) |

The term light-emitting diode is used herein in a broad sense to mean any suitable device for emitting electromagnetic radiation when appropriately energized by electric current. The light can be in either the visible or the invisible portions of the spectrum. Laser diodes could be used. Instead of emitting light directly, the energized elements of the light source can alternatively comprise optical shutters disposed in front of a continuously illuminated lamp or the like and arranged to be driven to an opened state in response to the capacitor discharge current hereinbefore described.

While particular embodiments of this invention have been shown and described, it will be obvious to those skilled in the art that various changes and modifications may be made without departing from the invention in its broader aspects. For example, the resistor 12 in FIG. 1 could be shunted by a diode poled to conduct capacitor discharge current if an even faster rising current pulse were desired. Therefore, it is intended in the appended claims to cover all such changes and modifications as fall within the true spirit and scope of the invention.

What I claim as new and desire to secure by Letters Patent of the United States is:

1. In combination:

a. a source of light comprising at least one element which when energized by an appropriate electrical input signal causes said source to issue an optical output signal;

b. a first capacitor;

c. means for coupling said capacitor in series circuit relationship with said element to a d-c power supply from which said capacitor accumulates a charge;

d. controllable switching means connected in parallel with said element and said first capacitor;

e. means responsive to a control signal for turning on said switching means, whereupon said capacitor discharges through both said switching means and said element, the capacitor discharge current serving as said input signal for said element;

f. a series combination of an inductor and a second capacitor connected in parallel with said first capacitor, said series combination introducing a ringing action in response to turnon of said switching means so as to turn off said switching means after a predetermined time delay, whereupon said d-c power supply recharges said capacitor; and g. a diode connected across said element and poled to conduct capacitor charging current.

2. The combination of claim 1 in which said element is a light-emitting diode poled to conduct capacitor discharge current.

3. The combination of claim 2 in which a resistor is connected in series with said light-emitting diode.

4. The combination of claim 2 in which said source of light comprises a plurality of light-emitting diodes connected in a parallel array, a plurality of resistors are respectively connected in series with the light-emitting diodes in said array, and said capacitor is disposed in series with said array.

5. The combination of claim 1 in which said controllable switching means is a thyristor having an anode, a cathode, and a gate to which a gate pulse is supplied in response to said control signal.

6. The combination of claim 5 further comprising a diode having an anode connected to the cathode of said thyristor and a cathode connected to said gate, and means for normally forward biasing said diode so as to maintain a relatively negative bias on said gate in the absence of said control signal, whereby the possibility of undesired turn on of said switching means by electrical noise is minimized.

7. The combination of claim 5 further comprising a zener diode connected between said gate and the cathode of said thyristor so as to prevent excessive potential on said gate.

8. The combination of claim 1 in which said coupling means includes said inductor.

9. The combination of claim 1 in which said series combination is connected in parallel with both said first capacitor and said element.

* * * * *